United States Patent
Kim et al.

(10) Patent No.: US 8,372,672 B2
(45) Date of Patent: Feb. 12, 2013

(54) NITRIDE SEMICONDUCTOR LIGHT EMITTING DEVICE AND METHOD OF MANUFACTURING THE SAME

(75) Inventors: Hyun Soo Kim, Gyunggi-do (KR); Joon Seop Kwak, Jeollanam-do (KR); Ki Man Kang, Jeollanam-do (KR); Jin Hyun Lee, Gyunggi-do (KR); Yu Seung Kim, Gyunggi-do (KR); Cheol Soo Sone, Gyunggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 802 days.

(21) Appl. No.: 12/209,644

(22) Filed: Sep. 12, 2008

(65) Prior Publication Data

US 2009/0159922 A1    Jun. 25, 2009

(30) Foreign Application Priority Data

Dec. 21, 2007  (KR) .......................... 10-2007-134904

(51) Int. Cl.
*H01L 21/00* (2006.01)
(52) U.S. Cl. .................... 438/46; 438/605; 257/E33.063
(58) Field of Classification Search .......... 257/E33.063; 438/604–605, 46
See application file for complete search history.

(56) References Cited

U.S. PATENT DOCUMENTS

| | | | |
|---|---|---|---|
| 5,075,756 A * | 12/1991 | Dutta ........................... | 257/745 |
| 6,313,534 B1 * | 11/2001 | Nakamura et al. ............ | 257/745 |
| 6,969,873 B2 | 11/2005 | Hata et al. | |
| 7,868,344 B2 * | 1/2011 | Kang et al. ...................... | 257/99 |
| 2005/0110031 A1 * | 5/2005 | Lai et al. ......................... | 257/97 |
| 2005/0230673 A1 * | 10/2005 | Mueller et al. .................. | 257/13 |
| 2007/0023775 A1 | 2/2007 | Jang | |
| 2007/0040162 A1 | 2/2007 | Song | |
| 2009/0065938 A1 | 3/2009 | Takano et al. | |

FOREIGN PATENT DOCUMENTS

| | | | |
|---|---|---|---|
| JP | 06-077537 A | | 3/1994 |
| JP | 09-008351 | * | 1/1997 |
| JP | 09-008351 A | | 1/1997 |
| JP | 09-219539 A | | 8/1997 |
| JP | 11-330610 A | | 11/1999 |
| JP | 2007-043164 A | | 2/2007 |

(Continued)

OTHER PUBLICATIONS

Japanese Office Action, w/ English language translation thereof, issued in Japanese Patent Application No. 2008-244675, dated Aug. 9, 2011.

(Continued)

*Primary Examiner* — Matthew Landau
*Assistant Examiner* — Sun M Kim
(74) *Attorney, Agent, or Firm* — McDermott Will & Emery LLP

(57) ABSTRACT

A nitride semiconductor light emitting device includes a light emitting structure having n-type and p-type nitride semiconductor layers and an active layer formed therebetween. N-type and p-type electrodes are electrically connected to the n-type and p-type nitride semiconductors, respectively. An n-type ohmic contact layer is formed between the n-type nitride semiconductor layer and the n-type electrode and has a first layer of a material In and a second layer formed on the first layer and of a material containing W. The nitride semiconductor light emitting device has thermal stability and excellent electrical characteristics without heat treatment.

4 Claims, 3 Drawing Sheets

FOREIGN PATENT DOCUMENTS

| | | | |
|---|---|---|---|
| JP | 2007-081088 A | | 3/2007 |
| JP | 2007-243143 A | | 9/2007 |
| JP | 2007258415 A | * | 10/2007 |
| KR | 10-2005-0089769 A | | 9/2005 |
| KR | 10-2007-0068537 A | | 7/2007 |
| KR | 10-2007-0079139 A | | 8/2007 |

OTHER PUBLICATIONS

Japanese Decision of Rejection, w/ English translation thereof, issued in Japanese Patent Application No. 2008-244675, dated Mar. 6, 2012.

* cited by examiner

NITRIDE SEMICONDUCTOR LIGHT EMITTING DEVICE AND METHOD OF MANUFACTURING THE SAME

CROSS-REFERENCE TO RELATED APPLICATIONS

This application claims the priority of Korean Patent Application No. 2007-0134904 filed on Dec. 21, 2007, in the Korean Intellectual Property Office, the disclosure of which is incorporated herein by reference.

BACKGROUND OF THE INVENTION

1. Field of the Invention

The present invention relates to a nitride semiconductor light emitting device and a method of manufacturing the same, and more particularly, to a nitride semiconductor light emitting device that includes an n-type electrode having thermal stability and excellent electrical characteristics without heat treatment and a method of manufacturing the same.

2. Description of the Related Art

A light emitting diode (LED) is one of semiconductor light emitting devices. When a current is applied, the LED can generate light of various colors by recombination of electrons and holes in a p-n junction between p-type and n-type semiconductors. When compared with a filament-based light emitting device, the LED has longer lifetime, low power consumption, excellent initial driving characteristics, high vibration resistance, and high tolerance for repetitive power switching. Thus, there has been an increasing demand for the LEDs. These days, group III nitride semiconductors that can emit light in short-wavelength region, such as a series of blue, have attracted attention.

FIG. 1 is a cross-sectional view illustrating a nitride semiconductor light emitting device according to the related art.

A nitride semiconductor light emitting device 10 includes a sapphire substrate 14, an n-type nitride semiconductor layer 11, an active layer 12, a p-type nitride semiconductor layer 13, a p-type ohmic contact layer 18, and an n-type ohmic contact layer 15, which are sequentially grown on the sapphire substrate 14. Here, the n-type ohmic contact layer 15 is formed on a region formed by etching the n-type nitride semiconductor layer 11. The nitride semiconductor light emitting device 10 further includes n-type and p-type electrodes 16a and 16b.

The semiconductor light emitting device 10 has a light emitting structure between the n-type and p-type electrodes 16a and 16b. That is, the semiconductor light emitting device 10 is a horizontal light emitting device. Light is generally emitted to the outside through the p-type ohmic contact layer 18.

In this case, then-type ohmic contact layer 15 is formed of Ti, Al, or the like, which has a relatively low work function, to form an ohmic contact with the n-type nitride semiconductor layer 11. Alternatively, the n-type ohmic contact layer 15 may include a stacked structure of Ti and Al.

In general, in order to obtain a structure having thermal stability, the ohmic contact layer 15 is formed by performing heat treatment at a temperature of 400° C. or more. However, the heat treatment may deteriorate the p-type ohmic contact layer 18 or the active layer 12 to reduce device characteristics and further increase manufacturing costs due to the heat treatment.

SUMMARY OF THE INVENTION

An aspect of the present invention provides a nitride semiconductor light emitting device that includes an n-type electrode having thermal stability and excellent electrical characteristics without heat treatment and a method of manufacturing the same.

According to an aspect of the present invention, there is provided a nitride semiconductor light emitting device including: a light emitting structure having n-type and p-type nitride semiconductor layers and an active layer formed therebetween; n-type and p-type electrodes electrically connected to the n-type and p-type nitride semiconductors, respectively; and an n-type ohmic contact layer formed between the n-type nitride semiconductor layer and the n-type electrode and having a first layer formed of a material containing In and a second layer formed on the first layer and formed of a material containing W.

The first layer may be formed of an In alloy.

An element contained in the In alloy may include at least one element selected from the group consisting of Ti, Al, Cr, Ni, Pd, Pt, Mo, Co, and Mg.

The second layer may be formed of a W alloy.

An element included in the W alloy may include at least one element selected from the group consisting of Ti, Al, Cr, Ni, Pd, Pt, Mo, Co, Cu, Hf, and Mg.

The first layer may have a thickness in the range of 10 to 300 Å.

The second layer may have a thickness in the range of 100 to 4000 Å.

The n-type ohmic contact layer may be formed on a Ga-polar face of the n-type nitride semiconductor layer.

According to another aspect of the present invention, there is provided a method of manufacturing a nitride semiconductor light emitting device, the method including: sequentially stacking an n-type nitride semiconductor layer, an active layer, and a p-type nitride semiconductor layer to prepare a light emitting structure; forming a first layer formed of a material containing In at one surface of the n-type nitride semiconductor layer and a second layer formed of a material containing W at the first layer to form an n-type ohmic contact layer; forming an n-type electrode on the n-type ohmic contact layer; and forming a p-type electrode to be electrically connected to the p-type nitride semiconductor layer.

The forming an n-type electrode on the n-type ohmic contact layer may be performed after forming the n-type ohmic contact layer without heat treatment of the n-type ohmic contact layer.

The forming a first layer may be performed by sputtering.

The forming a second layer may be performed by sputtering.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
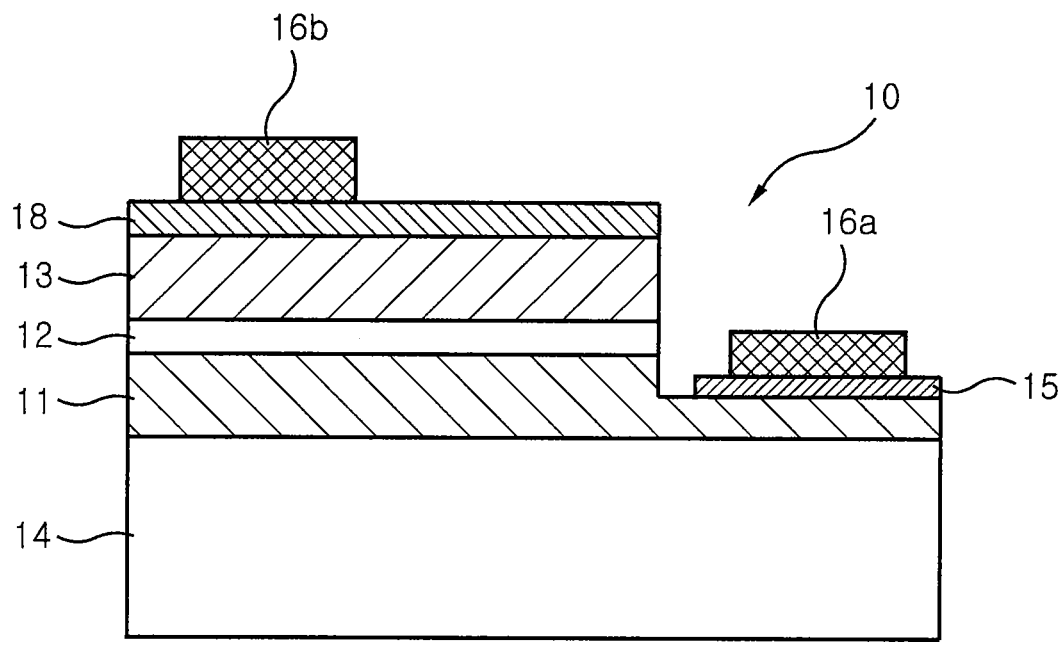
FIG. 1 is a cross-sectional view illustrating a nitride semiconductor light emitting device according to the related art.

Exemplary embodiments of the present invention will now be described in detail with reference to the accompanying drawings.

The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 2:
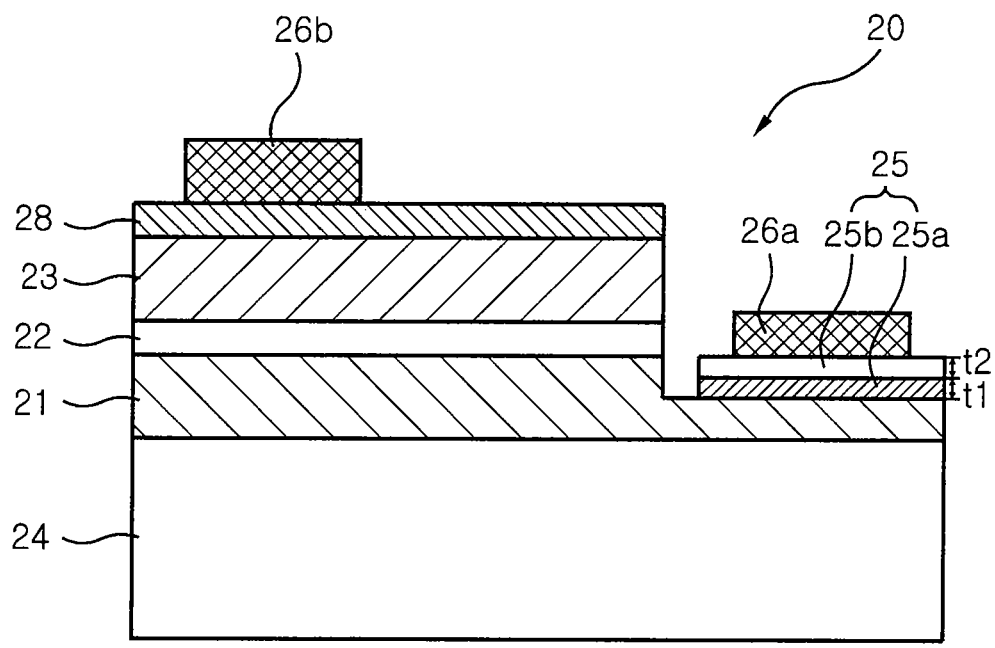
FIG. 2 is a cross-sectional view illustrating a nitride semiconductor light emitting device according to an exemplary embodiment of the present invention.

FIG. 2 is a cross-sectional view illustrating a nitride semiconductor light emitting device according to an exemplary embodiment of the present invention.

A nitride semiconductor light emitting device 20 according to this embodiment includes a sapphire substrate 24, an n-type nitride semiconductor layer 21, an active layer 22, a p-type nitride semiconductor layer 23, a p-type ohmic contact layer 28, and an n-type ohmic contact layer 25, which are sequentially grown on the sapphire substrate 24. The n-type ohmic contact layer 25 is formed on a region formed by etching the n-type nitride semiconductor layer 21 and includes first and second layers 25a and 25b. The nitride semiconductor light emitting device 20 further includes n-type and p-type electrodes 26a and 26b.

Components that form the semiconductor light emitting device 20 will now be described in detail.

First, the n-type and p-type nitride semiconductor layers 21 and 23 and the active layer 22 that form a light emitting structure will be described. In the specification, a "nitride semiconductor" refers to a binary, ternary, or quaternary compound semiconductor, which is expressed as equation of $Al_xIn_yGa(1-x-y)N$ (here, $0 \leq x \leq 1$, $0 \leq y \leq 1$, $0 \leq x+y \leq 1$).

That is, the n-type and p-type nitride semiconductor layers 21 and 23 may be formed of semiconductor materials doped with an n-type impurity and a p-type impurity, which are expressed as equation of $Al_xIn_yGa(1-x-y)N$ (here, $0 \leq x \leq 1$, $0 \leq y \leq 1$, $0 \leq x+y \leq 1$). Examples of the semiconductor materials may include GaN, AlGaN, and InGaN. Examples of the n-type impurity may include Si, Ge, Se, Te, or C, and examples of the p-type impurity may include Mg, Zn, or Be.

The active layer 22 is formed of an undoped nitride semiconductor layer that has a single or multiple quantum well structure, and emits light having predetermined energy by recombination of electrons and holes.

The n-type and p-type nitride semiconductor layers 21 and 23 and the active layer 22 may be grown by using a process of growing a semiconductor single crystal, in particular, by using metal organic chemical vapor deposition (MOCVD), molecular beam epitaxy (MBE), or hydride vapor phase epitaxy (HVPE), which is known as a nitride single crystal growth process.

The n-type and p-type electrodes 26a and 26b serve as electrodes for an electrical connection of a device. In general, each of the n-type and the p-type electrodes 26a and 26b is formed of an alloy containing Au or Au. The n-type and p-type electrodes 26a and 26b may be formed by using a sputtering process or E-beam evaporation, which is a general method of growing a metal layer.

The n-type ohmic contact layer 25 may electrically form an ohmic contact between the n-type nitride semiconductor layer 21 and the n-type electrode 26a.

To this end, the n-type ohmic contact layer 25 includes two layers. Specifically, the first layer 25a is formed of a material containing indium (In), and the second layer 25a formed on the first layer 25a is formed of a material containing tungsten (W).

The first layer 25a is formed of a material as long as it contains In. The first layer 25a may be only formed of In or an In alloy.

In is a metal that has a relatively low work function of approximately 4.12 eV. In is appropriate as a metal to form an n-type ohmic contact and has excellent electrical characteristics. Preferably, in terms of a manufacturing process, an In layer may be formed on the n-type nitride semiconductor layer 21 by using a sputtering process, but not e-beam evaporation. Since In has a low melting point of approximately 157° C., it is difficult to control In by using general e-beam evaporation.

Meanwhile, when the first layer 25a is formed of an In alloy, examples of elements contained in the in alloy may include Ti, Al, Cr, Ni, Pd, Pt, Mo, Co, and Mg. The element may be appropriately selected in consideration of electrical resistance.

The second layer 25b is formed of W or a W alloy, which is thermally stable. Thus, an ohmic contact layer may be used as an element without additional heat treatment for thermal stability.

Like the first layer 25a, preferably, the second layer 25b containing W may be formed by using a sputtering process. Since W has a melting point of approximately 3407° C., it is very difficult to evaporate W by using general e-beam evaporation.

When the second layer 25b is formed of a W alloy, examples of elements contained in the W alloy may include Ti, Al, Cr, Ni, Pd, Pt, Mo, Co, Cu, Hf, and Mg. The elements may be appropriately selected in consideration of electrical resistance.

As described above, the n-type ohmic contact layer 25 according to this embodiment may be formed on the n-type nitride semiconductor layer 21 by using a sputtering process. The first layer 25a is formed of In, which is advantageous to form an ohmic contact, and the second layer 25b is formed of the W alloy having thermal stability. In this way, excellent characteristics of the n-type ohmic contact layer can be ensured.

In this embodiment, thicknesses t1 and t2 of the first layer 25a and the second layer 25b included in the n-type ohmic contact layer 25 may be appropriately controlled in consideration of electrical characteristics and thermal stability.

In this case, the thickness t1 of the first layer 25a may be in the range of 10 to 300 Å, and the thickness t2 of the second layer 25b may be in the range of 100 to 4000 Å.

The p-type ohmic contact layer 28 may not be necessarily used. The p-type ohmic contact layer 28 may have a Ni/Au structure to form an ohmic contact with the p-type nitride semiconductor layer 23.

Figure 3:
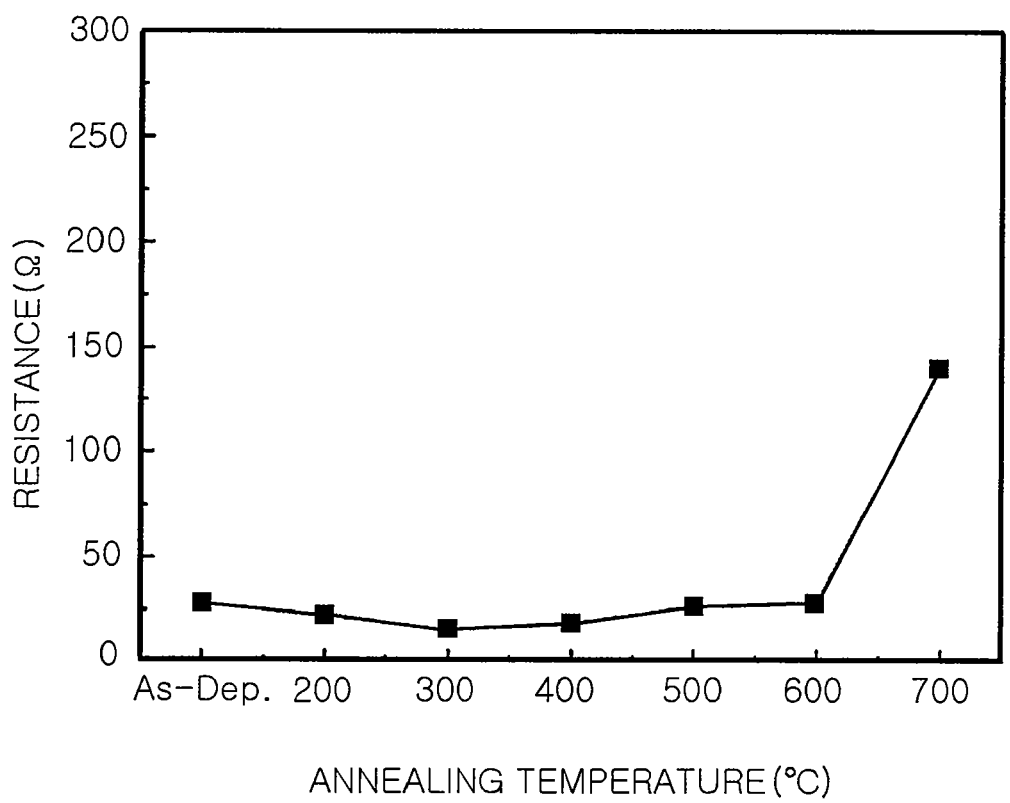
FIG. 3 is a graph illustrating a change in resistance according to heat treatment temperature in an n-type ohmic contact layer used in an embodiment of the present invention, the graph obtained from an I-V curve according to CTLM measurement with a gap spacing of 28 μm.

FIG. 3 is a graph illustrating a change in resistance according to heat treatment (annealing) temperature in an n-type ohmic contact layer used in the present invention. The graph is obtained on the basis of an I-V curve obtained by CTLM measurement with a gap spacing of 28 μm. A light emitting device having the structure according to the embodiment, described in FIG. 2, is used in the experiment. The n-type ohmic contact layer is formed on a Ga-polar face of the n-type nitride semiconductor layer.

Meanwhile, the resistance is obtained by adding contact resistance of the n-type nitride semiconductor layer, resistance of the In layer, and resistance of the n-type nitride semiconductor layer. Here, the heat treatment of the n-type ohmic contact layer may be generally known rapid thermal anneal (RTA).

According to other experimental conditions, an In layer of 20 nm may be used as the first layer, and a TiW layer of 200 nm may be used as the second layer.

Referring to the graph of FIG. 3, there is little change from a state As-Dep. where heat treatment is not performed to a state where heat treatment is performed at a temperature of approximately 600° C. Further, the resistance increases significantly due to thermal damage at a temperature higher than 600° C.

As described above, the n-type ohmic contact layer having the In/TiW structure according to this embodiment has excellent electrical characteristics without additional heat treatment. Further, the W alloy having excellent heat resistance is formed on the edge to obtain thermal stability.

The n-type ohmic contact layer having the structure, described in FIG. 3 (In layer of 20 nm and TiW layer of 200 nm), has characteristics of a first order function, that is, linear characteristics as a result of analyzing the I-V curve obtained by the CTLM measurement with the gap spacing of 28 μm. That is, the n-type ohmic contact layer used in the embodiment of the invention has high thermal stability and forms an ohmic contact with the n-type nitride semiconductor layer.

According to the result of the experiment, the n-type ohmic contact layer used in the embodiment of the invention has the excellent result when it is grown on the Ga-polar face of the n-type nitride semiconductor layer. However, the present invention is not limited thereto. The n-type ohmic contact layer can be applied to an n-polar face, that is, a vertical light emitting device.

Figure 4:
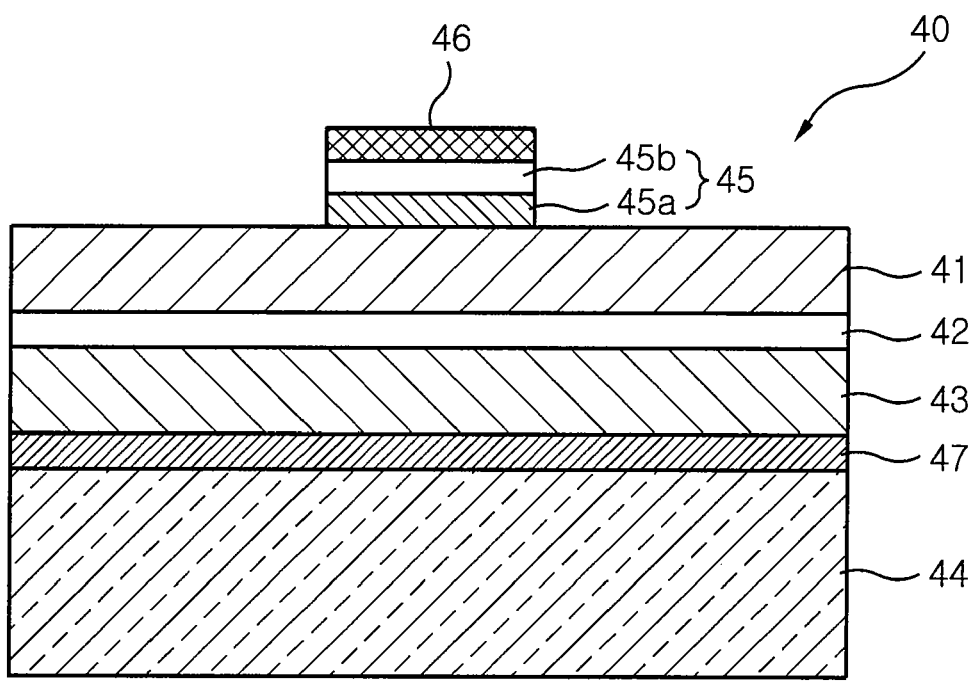
FIG. 4 is a cross-sectional diagram illustrating a nitride semiconductor light emitting device according to another exemplary embodiment of the present invention.

FIG. 4 is a cross-sectional view illustrating a nitride semiconductor light emitting device according to another exemplary embodiment of the present invention.

Referring to FIG. 4, the nitride semiconductor light emitting device 40 according to this embodiment includes a conductive substrate 44, and a high reflection ohmic contact layer 47, a p-type nitride semiconductor layer 43, an active layer 42, an n-type nitride semiconductor layer 41, and an n-type ohmic contact layer 45, which are sequentially formed on the conductive substrate 44. Further, an n-type electrode 46 is formed on an upper surface of the n-type ohmic contact layer 45.

This embodiment of the invention corresponds to a vertical nitride semiconductor light emitting device. The vertical nitride semiconductor light emitting device may be manufactured by using a known method. That is, after the n-type nitride semiconductor layer 41, the active layer 42, and the p-type nitride semiconductor layer 43 are sequentially grown on a sapphire substrate for nitride single crystal growth or the like, the high reflection ohmic contact layer 47 and the conductive substrate 44, which is a support substrate, are formed thereon by using a plating method or a bonding method, and then the sapphire substrate is removed therefrom. Further, since light generated from the active layer 42 is generally emitted toward the n-type electrode 46, preferably, in this embodiment, the n-type ohmic contact layer 45 and the n-type electrode 46 may have almost the same width in terms of light extraction efficiency.

Besides the above-described difference, the components represented by the same terms can be considered as the same components in FIG. 2. New components will be only described.

The high reflection ohmic contact layer 47 may have reflexibility of 70% or more and form an ohmic contact with the p-type nitride semiconductor layer 43. However, the present invention is not limited thereto. The high reflection ohmic contact layer 47 may be at least one layer formed of a material selected from the group consisting of Ag, Ni, Al, Rh, Pd, Ir, Ru, Mg, Zn, Pt, Au, and a combination thereof. Preferably, the high reflection ohmic contact layer 47 may be formed of Ni/Ag, Zn/Ag, Ni/Al, Zn/Al, Pd/Ag, Pd/Al, Ir/Ag, Ir/Au, Pt/Ag, Pt/Al, or Ni/Ag/Pt.

The conductive substrate 44 is included in the final components of the vertical light emitting device. The conductive substrate 44 supports a light emitting structure having a relatively small thickness when performing a process, such as removal of the single crystal growth substrate. Further, the conductive substrate 44 may be provided as a bonding region with respect to a PCB by using a conductive adhesive layer and serve as a p-type electrode. The conductive substrate 44 may be coupled to the light emitting structure by using a plating method or a wafer bonding method and may be formed of a material, such as Si, Cu, Ni, Au, W, or Ti.

Figure 5:
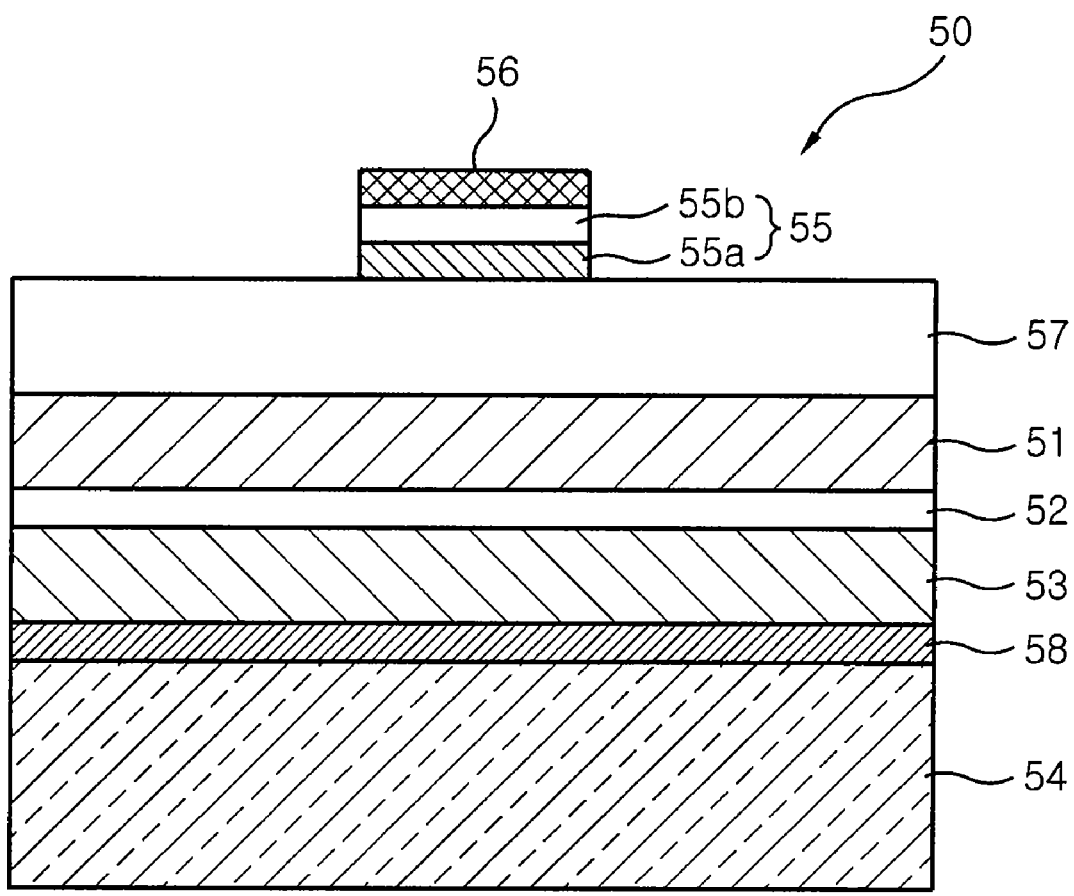
FIG. 5 is a cross-sectional view illustrating a nitride semiconductor light emitting device according to still another exemplary embodiment of the present invention that is a modification of the embodiment of FIG. 4.

FIG. 5 is a cross-sectional view illustrating a nitride semiconductor light emitting device according to still another embodiment of the present invention, which is a modification of the embodiment of FIG. 4.

Like the nitride semiconductor light emitting device shown in FIG. 4, a nitride semiconductor light emitting device 50 according to this embodiment includes a conductive substrate 54 and a high reflection ohmic contact layer 58, a p-type nitride semiconductor layer 53, an active layer 52, an n-type nitride semiconductor layer 51, and an n-type ohmic contact layer 55 including first and second layers 55a and 55b, which are sequentially formed on the conductive substrate 54. An n-type electrode 56 is formed on the n-type ohmic contact layer 55.

Further, a GaN substrate 57 is formed between the n-type nitride semiconductor layer 51 and the n-type ohmic contact layer 55.

Since the GaN substrate 57 is provided as a nitride single crystal growth substrate and has electrical conductivity, the GaN substrate 57 does not need to be removed after the growth of a light emitting structure but can be left in the final light emitting device 50. Instead of the GaN substrate 57, different substrates formed of materials having electrical conductivity, for example, a SiC substrate may be used as a nitride single crystal growth substrate if a person skilled in the art can easily select the substrate.

Besides the above-described difference, other components represented by the same terms can be considered as the same components in FIG. 4. Thus, a description thereof will be omitted.

As set forth above, according to the exemplary embodiments of the invention, it is possible to provide a nitride semiconductor light emitting device that includes an n-type electrode having thermal stability and excellent electrical characteristics without heat treatment.

Further, according to the embodiment of the invention, it is possible to provide a method of manufacturing a nitride semiconductor light emitting device optimized to obtain the excellent thermal and electrical characteristics.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a nitride semiconductor light emitting device, the method comprising:
    sequentially stacking an n-type nitride semiconductor layer, an active layer, and a p-type nitride semiconductor layer to prepare a light emitting structure;
    forming a first layer formed of In at one surface of the n-type nitride semiconductor layer and a second layer formed of a material containing W at the first layer to form an n-type ohmic contact layer;
    forming an n-type electrode on the n-type ohmic contact layer; and
    forming a p-type electrode to be electrically connected to the p-type nitride semiconductor layer, wherein
    the forming an n-type electrode on the n-type ohmic contact layer is performed after forming the n-type ohmic contact layer without heat treatment of the n-type ohmic contact layer, and
    the n-type ohmic contact layer is formed on a Ga-polar face of the n-type nitride semiconductor layer.

2. The method of claim 1, wherein the forming a first layer is performed by sputtering.

3. The method of claim 1, wherein the forming a second layer is performed by sputtering.

4. The method of claim 1, wherein the first layer comprises a layer formed of a single material of In.

* * * * *